United States Patent
Chemin et al.

(10) Patent No.: US 7,895,004 B2
(45) Date of Patent: Feb. 22, 2011

(54) METHOD FOR MEASURING ELECTRIC CURRENT IN A PLURALITY OF CONDUCTORS

(75) Inventors: Michaël Chemin, Festigny (FR); Frédéric Leroux, Créteil (FR); François-Xavier Bernard, Créteil (FR)

(73) Assignee: Valeo Equipements Electriques Moteur, Creteil (FR)

( * ) Notice: Subject to any disclaimer, the term of this patent is extended or adjusted under 35 U.S.C. 154(b) by 477 days.

(21) Appl. No.: 11/570,931

(22) PCT Filed: Jun. 30, 2005

(86) PCT No.: PCT/FR2005/001664
§ 371 (c)(1),
(2), (4) Date: Sep. 2, 2008

(87) PCT Pub. No.: WO2006/010865
PCT Pub. Date: Feb. 2, 2006

(65) Prior Publication Data
US 2008/0312854 A1    Dec. 18, 2008

(30) Foreign Application Priority Data
Jun. 30, 2004    (FR)    ................................... 04 07261

(51) Int. Cl.
*G01R 19/20*    (2006.01)
(52) U.S. Cl. .................. 702/64; 702/115; 702/183; 324/117 R; 324/117 H; 324/127; 324/251
(58) Field of Classification Search .................. 702/64, 702/115, 183; 324/244, 260, 117 R, 117 H, 324/127, 251; 318/431, 430, 432, 433, 434; 361/98, 100, 154, 187
See application file for complete search history.

(56) References Cited

U.S. PATENT DOCUMENTS

| | | | |
|---|---|---|---|
| 4,418,312 A | 11/1983 | Figler et al. | |
| 4,933,630 A | 6/1990 | Dupraz | |
| 5,237,493 A * | 8/1993 | Durig et al. | 363/73 |
| 5,907,244 A | 5/1999 | Crabill et al. | |
| 6,040,690 A * | 3/2000 | Ladds | 324/142 |
| 6,285,191 B1* | 9/2001 | Gollomp et al. | 324/427 |
| 6,310,470 B1* | 10/2001 | Hebing et al. | 324/117 R |
| 6,583,613 B1* | 6/2003 | Hohe et al. | 324/117 R |
| 7,106,046 B2* | 9/2006 | Nagano et al. | 324/117 H |
| 2005/0012496 A1* | 1/2005 | Taniguchi | 324/117 R |
| 2007/0103011 A1* | 5/2007 | Neal | 310/67 R |

FOREIGN PATENT DOCUMENTS

| | | |
|---|---|---|
| DE | 2845155 | 4/1980 |
| EP | 0597404 | 5/1994 |
| EP | 0947843 | 10/1999 |

\* cited by examiner

*Primary Examiner*—Carol S Tsai
(74) *Attorney, Agent, or Firm*—Jacox, Meckstroth & Jenkins

(57) ABSTRACT

A method and system for measuring electric current in a plurality (n) of conductors. According to the invention, the method comprises the following steps: an electric current transducer is place substantially opposite to each conductor (I, i=1, ..., n); a decorrelation matrix ([G]), which is a function of the position of the transducers in relation to the conductors, is constructed; the current ($I_{mesi}$) in each conductor (i) is measured with the aid of electric current transducers and real currents ($I_{réeli}$) are deduced with the aid of the decorrelation matrix ([G]) and the measured currents ($I_{mesi}$).

18 Claims, 3 Drawing Sheets

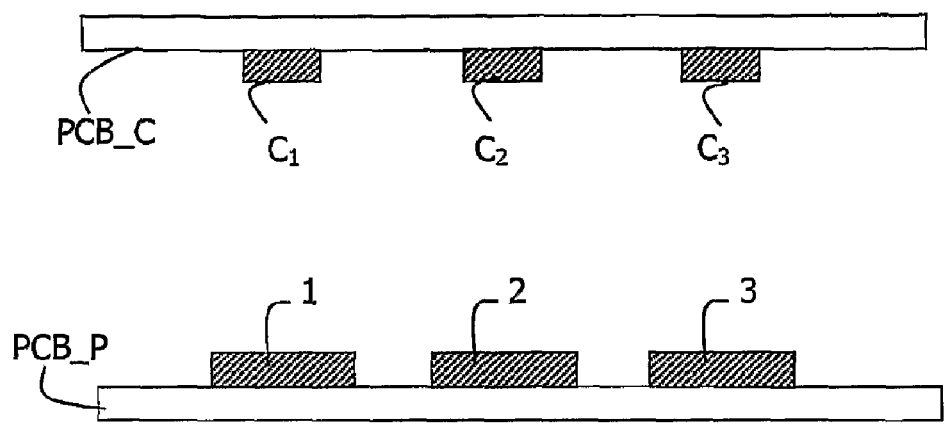
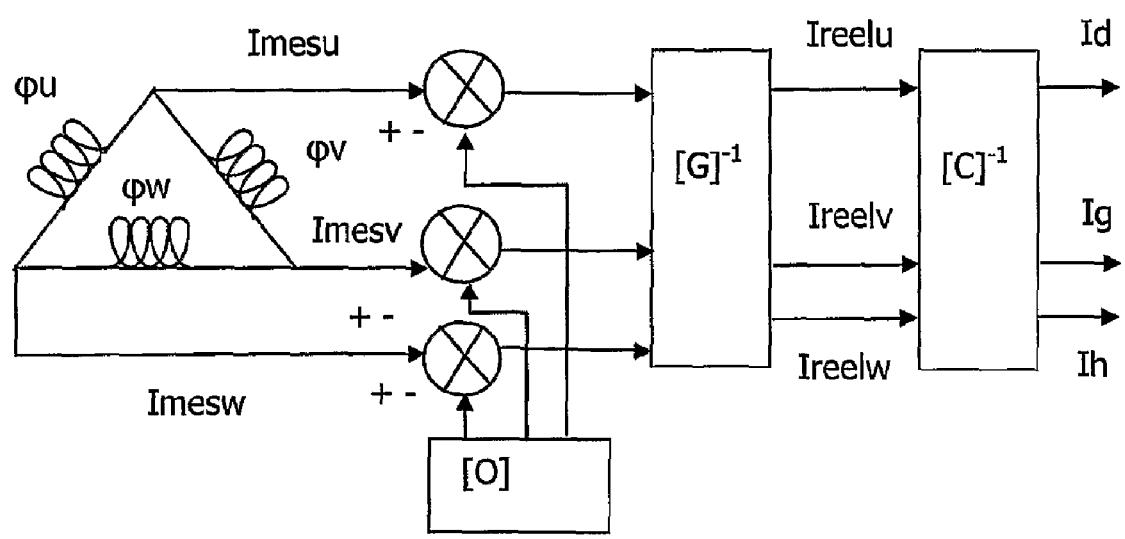
FIG. 4

METHOD FOR MEASURING ELECTRIC CURRENT IN A PLURALITY OF CONDUCTORS

BACKGROUND OF THE INVENTION

1. Field of the Invention

The present invention concerns a method of measuring an electric current in a plurality of conductors and a device for implementing such a method.

The invention finds a particularly advantageous application in the field of rotary electrical machines used in the automotive industry.

2. Description of the Related Art

Motor vehicles with a thermal engine can be equipped with reversible electrical machines, also referred to as alternator/starters, functioning both in alternator mode and in motor mode on starting up or as an aid to boosting as from 500 revolutions/min for the thermal engine.

The reversible electrical machine also comprises a power unit and a control unit, the power unit serving as a current inverter in starter mode and as current rectifier in alternating mode and is controlled by the control unit.

In this type of machine, it is necessary to be able at all times to control the torque supplied or taken off by the alternator/starter. However, this torque depends directly on the current of the stator of the machine and more precisely on the currents at the various phases of the stator when the latter is functioning in multiphase current, for example three-phase. In order to monitor and subsequently regulate the various stator currents, there therefore exists a current regulation unit that is generally numeric.

In the machine, these currents pass through conductors, generally with a high cross section, placed between the stator and a rectifier, or inverter, on the power unit.

These conductors are for example parallel rectilinear conductors referred to as bus-bars.

The advantage, for a control of the alternator/starter most appropriate to the functioning of the vehicle engine, of knowing precisely the currents passing over the n bus-bars, n being equal to 3 in three-phase machines, will therefore be understood.

In order to determine the stator currents, recourse is had to various known types of device.

FIG. 1 is a side view of a known device using a magnetic circuit CM made from ferrite surrounding each conductor CO and closing over a Hall effect sensor CA that measures the magnetic field used by the current I passing through the conductor CO, the sensor being opposite the magnetic circuit. Such a device is fixed to a dissipater of the alternator/starter power unit.

However, these devices are expensive, bulky and complex to use since they require firstly a connecting link between the sensor and the control unit normally referred to as a control card and secondly passing each conductor of bus-bar through a ferrite magnetic circuit.

Devices based on electrical shunts are also known, which are however not well suited if it is wished to measure very intense currents (800 A for example) with few losses by Joule effect. In addition, there exist problems of connection to the conductors. Finally, in the case of low shunt values there is a great deal of impreciseness with regard to the measurements of the low currents.

SUMMARY OF THE INVENTION

Thus a technical problem to be resolved by this object of the present invention is to propose a method of measuring the electric current in a plurality of conductors that would be inexpensive, without losses and easy to use, whilst guaranteeing precise determination of the currents sought.

The solution to the technical problem posed consists, according to the present invention, of the method comprising the steps of:
placing an electric current transducer substantially opposite each conductor, one conductor being rigid,
constructing a decorrelation matrix that is a function of the position of the transducers with respect to the conductors,
measuring the currents in each conductor by means of the electric current transducers and deducing therefrom the real currents by means of the decorrelation matrix and the measured currents.

Thus the method according to the invention requires the use only of simple magnetic field transducers without a magnetic circuit, the transducers being magnetic field sensors, preferably such as Hall effect sensors, that are compact. No dissipation of energy by Joule effect can occur, and the measurement of the current in each conductor is precise and reproducible, the decorrelation matrix involving only fixed parameters definitively determined by the respective arrangement of the transducers with respect to the associated electrical conductors.

According to the invention, the decorrelation matrix comprises elements that are determined by successively applying a calibrated current in each conductor, the current applied in the other conductors being zero, and measuring, by means of the transducers, an electric current signal associated with each conductor. The real currents are then deduced from the measured currents by applying the matrix that is the inverse of the decorrelation matrix.

The precision of the measurement can be increased further in the case of offsets on the currents due in particular to the imprecision of the sensors and of the circuit measuring the currents, if the method according to the invention also comprises a step of determining an offset matrix the elements of which are equal to the currents measured in each conductor in the absence of currents applied in the conductors, the real currents being deduced from the measured currents by means of the decorrelation matrix and the offset matrix.

Then a real current matrix is obtained by subtracting the offset matrix from a measured current matrix and applying the matrix that is the inverse of the decorrelation matrix to the result obtained.

Finally, in one application of the method that is the object of the invention to the measurement of the electric current in the input/output conductors of the poles of a stator of a rotary electrical machine, the invention provides for an inverse projection matrix to be multiplied by the matrix that is the inverse of a decorrelation matrix in order to produce a single matrix applied to the measured output currents of the stator in order to effect a numeric regulation of currents of the rotary electrical machine.

This last provision has the advantage that the numeric regulation processor includes, by means of a single matrix, both the measurement of the currents (the matrix that is the inverse of the decorrelation matrix) and a transformation making it possible to change from an n-phase reference frame to a two-phase reference frame (inverse projection matrix).

Other objects and advantages of the invention will be apparent from the following description, the accompanying drawings and the appended claims.

BRIEF DESCRIPTION OF THE DRAWINGS

The description that follows with regard to the accompanying drawings, given by way of non-limiting examples, will give a clear understanding of what the invention consists and how it can be implemented.

FIG. 3 is a partial side view of the device in FIG. 2, FIG. 4 is a diagram of an application of the method according to the invention to the measurement of the electric current in the input/output conductors of the poles of a stator of a rotary electrical machine.

DETAILED DESCRIPTION OF THE PREFERRED EMBODIMENTS

Figure 2:
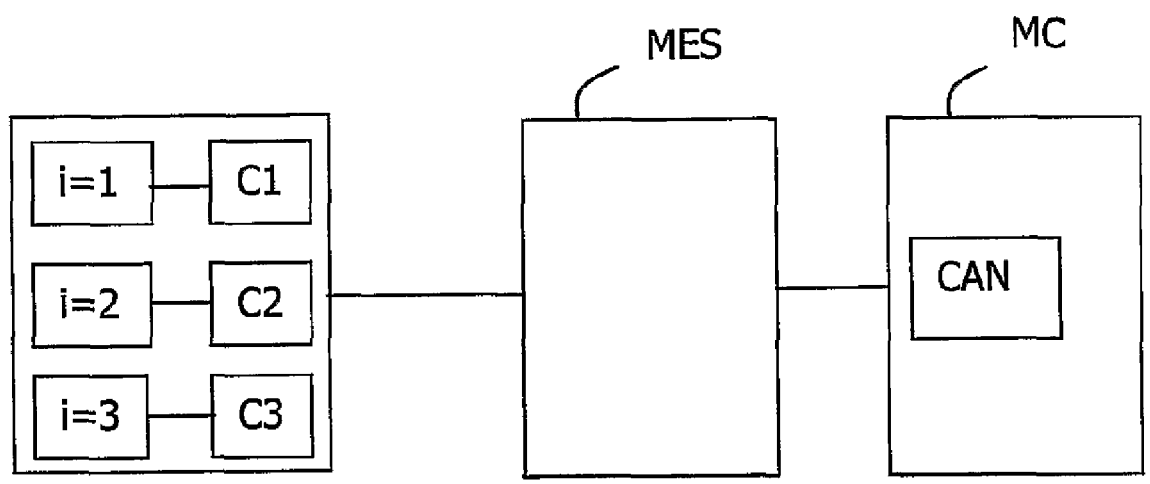
FIG. 2 is a diagram of the current measuring device implementing the method according to the invention.

FIG. 2 depicts a device intended for measuring the electric current in n conductors each marked by the letter i.

This device comprises:
sensors $C_i$ intended to measure the magnetic field corresponding to each of the n conductors,
a circuit MES for measuring the voltage corresponding to each electric current passing through the conductors i, this circuit being intended to transpose the voltage measured at the terminals of the sensors $C_i$ from a first reference (for example −10V, +10V) into a second reference (for example 0V-5V), and
a measurement management microcontroller MC intended in particular to control the stator currents, the microcontroller MC comprising an analogue to digital converter CAN intended to convert the transposed measurement (between 0V-5V) issuing from the measurement circuit MES into a digital unit preferentially in 8, 10 or 12 bits, which corresponds to 256, 512 or 1024 points).

In the case depicted in FIG. 2, the conductors are three in number (n=3). This situation arises, for example, when the device depicted and the method that it implements are applied to the measurement of the electric current in the conductors connected to the poles of a stator of a three-phase reversible electrical machine, also referred to as an alternator/starter. The conductors i are for example the bus-bars of the stator, called in English "bus-bars". They may also be cables or rods or any other type of current conductors, preferably rigid. The rigid character makes it possible in particular to obtain a stable and fixed decorrelation matrix once and for all, a matrix that will be seen in detail below.

The measurement method associated with the device in FIG. 2 comprises the following steps.

In a first step, an electric current transducer $C_i$ is placed substantially opposite each conductor i (i=1, 2, 3) as indicated in FIG. 3. Preferentially, the transducer $C_i$ is a magnetic field measurement sensor such as a Hall effect sensor. The advantage of a Hall effect sensor is to make it possible to measure wide ranges of values of magnetic fields, with a great deal of precision. In addition, it makes it possible, from a measured current, to supply a quantity proportional to the real measured current and therefore representative of the real measured current, that is to say a voltage, a frequency or a current for example.

Preferably, each conductor i, or bus-bar, is placed on the power card PCB_P. Advantageously, each transducer or sensor $C_i$ is placed substantially opposite each conductor i on the control card PCB_C. Naturally the sensors $C_i$ are placed so that they do no saturate over the range of measurements.

Thus, the sensors no longer being on the dissipater of the power card and being directly placed on the control card, there is no longer any need for connections in order to connect them from the dissipater to the control card. This has the advantage of eliminating the problems of reliability and problems of mechanical stresses due to bulky and expensive connections, the mechanical stresses often being dependent on vibrations coming from the vehicle for example.

Figure 1:
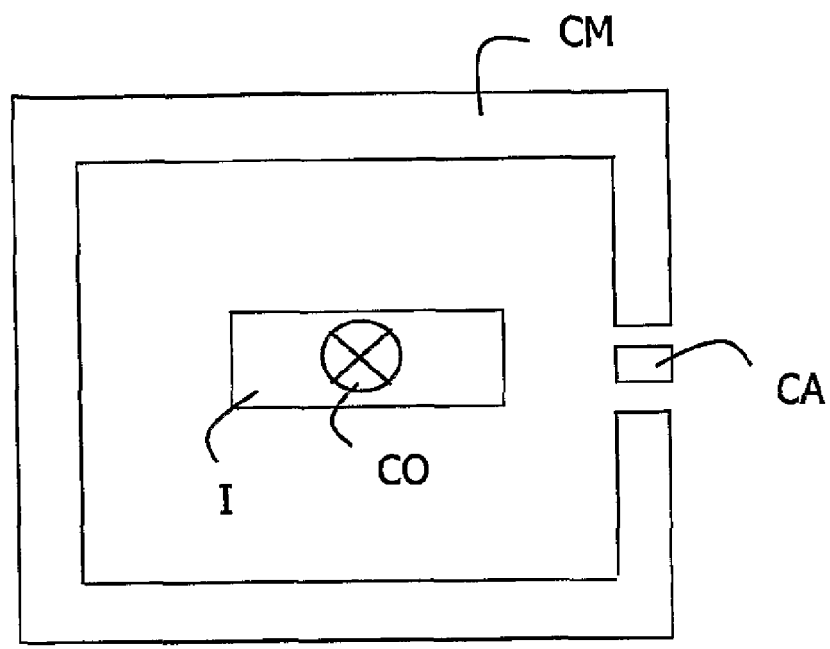
FIG. 1 is a diagram of a current measuring device according to the prior art.

Likewise, the transducer $C_i$ no longer being placed in a ferrite magnetic circuit as in the prior art of FIG. 1, the magnetic field circulating in each conductor i is no longer channeled by the magnetic circuit. Consequently edge effects may occur, in that the transducer $C_i$ will be just as sensitive to the magnetic field of the associated conductor i disposed opposite as to the magnetic fields of the other two conductors i. This problem is resolved in the following manner.

Secondly, during an initialization step, a calibrated current $I_j^0$ is applied to a conductor j, no current being applied in the other conductors i ($i \neq j$) and then, by means of each transducer $C_i$, an associated current signal $I_i$ is measured. The equivalent current $I_i$ measured is not zero for the conductors, i ($i \neq j$) because the transducers $C_i$ ($i \neq j$) detect the magnetic field produced by the current $I_j^0$ in the conductor j and therefore supply an electrical current signal corresponding to this magnetic field. It is possible for example to take a calibrated current $I_j^0$ equivalent to the maximum current that the inverter can withstand, for example 1000 amperes. In another example a calibrated current value $I_j^0$ facilitating the management microcontroller MC can be taken, for example a power of 2. In the case of a power of 2, the value of 819.2 amperes can be, for example, taken for a resolution of 0.1 amperes, which corresponds to $8192=2^{13}$. Thus this facilitates the calculation of the division that follows, since this time the microcontroller effects only offsets. Naturally, as explained before, according to the sensor $C_i$, the current signal $I_i$ is a quantity that can be expressed as current, voltage, frequency etc, this current signal $I_i$ representing the real measured current when no current is applied to the other conductors.

There are deduced from this n elements $G_{ij}$ of a decorrelation matrix [G], j being fixed and i variable from I to n, by means of the equation:

$$G_{ij}=I_i/I_j^0 \quad [1]$$

In the case of three conductors, the elements $G_{11}$, $G_{21}$ and $G_{31}$ are deduced from the application of a current $I_1^0$ in the conductor i=1 and from the measurement of the currents $I_1$, $I_2$, and $I_3$:

$$I_1=G_{11}\cdot I_1^0$$

$$I_2=G_{21}\cdot I_1^0$$

$$I_3=G_{31}\cdot I_1^0$$

Performing this operation n times by applying a calibrated current to each conductor, the $n^2$ elements $G_{ij}$ of the matrix [G] are deduced from this.

For three conductors, the matrix [G] is written:

$$[G] = \begin{vmatrix} G_{11} & G_{12} & G_{13} \\ G_{21} & G_{22} & G_{23} \\ G_{31} & G_{32} & G_{33} \end{vmatrix}$$

This decorrelation matrix [G], and its inverse matrix $[G]^{-1}$, are thus calculated by the microcontroller MC and saved in one of its memories, for example rewritable EEPROM (not shown).

In normal operating mode on a vehicle, the currents $I_{measi}$ Of each conductor i are measured by means of the electric current transducers $C_i$ in order to deduce therefrom the real currents $I_{reaij}$ by means of the matrix equation: $[I_{real}]=[G]^{-1}[I_{meas}]$.

The matrix [G] is therefore essentially geometric in nature and it takes account in particular of the possible tolerances in mounting of the sensors, in particular the dispersion on the distances between the bus-bars and the sensors.

Thus this decorrelation matrix [G] makes is possible to limit the influence of the currents external to the current to be measured and consequently of the magnetic field measured by a sensor $C_i$.

In the case of application to the currents of the three-phases u, v, w of the stator of a reversible electrical machine, the real currents obtained from the measured currents by:

$$\begin{vmatrix} I_{realu} \\ I_{realv} \\ I_{realw} \end{vmatrix} = [G]^{-1} \begin{vmatrix} I_{measu} \\ I_{measv} \\ I_{measw} \end{vmatrix}$$

Preferably the current measurement calculation method comprises an additional calibration step also making it possible to take account of offsets, called "offsets" in English, which are due to its imprecision in measurement caused in particular by:
- the sensors Ci,
- the components of the measurement circuit MES,
- the components of the analogue to digital converter CAN of the microcontroller MC.

For example, the converter CAN will be accurate to within one bit corresponding to more or less 0.5 A if the measurement is converted in 12 bits for a measurement range of more or less 1000 A ($2000/2^{12}=0.5$). For a measurement range of more or less 100 A, the converter CAN will be accurate to within one bit, corresponding to more or less 0.5 A if the measurement is converted in 12 bits.

Thus a count is taken of the offsets by means of an offset matrix [O] whose elements $O_i$ are equal to the currents measured in each conductor i in the absence of currents supplied in the conductors, the real current matrix ($I_{real}$) is then given by: $[I_{real}]=[G]^{-1}([I_{meas}]-[O])$.

The elements $O_i$ can also be numerical values corresponding to the measured currents.

In the case of three conductors, the offset matrix (O) is written:

$$[O] = \begin{vmatrix} O_1 \\ O_2 \\ O_3 \end{vmatrix}$$

This matrix [O] is also calculated by the microcontroller MC and saved in one of its memories, for example rewritable EEPROM (not shown).

When this calibration step is taken into account, the decorrelation matrix [G] is calculated in accordance with the following equation:

$$G_{ij}=(I_i-Oi)/I_j^0 \qquad [2]$$

with Oi corresponding to the offset of the measured current $I_j$, i (i≠j) during the initial initialization step.

Note that the matrices [G] and [O] can include respectively the various gains in the chain and offsets, which makes it possible to recenter or adjust the signals to a value corresponding to zero.

Thus, in the case where only the offsets due to the sensors will be taken into account, the decorrelation matrix [G] will be expressed in ohms and subsequently the inverse matrix $[G]^{-1}$ in siemens. One example of such a matrix is given below with each sensor $C_i$ maintained at a distance of approximately 2.5 cm from the vertical of their associated bus-bar i and a first sensor $C_1$ being at a diagonal distance of 5.5 cm with respect to the second bus-bar 2 and at a diagonal distance of 10.5 cm with respect to the third bus-bar 3:

$$[G^{-1}] = \begin{vmatrix} 4021 & -1250 & -156 \\ -972 & 4212 & -972 \\ -79 & -864 & 3981 \end{vmatrix}$$

with a corresponding offset matrix [O] equal to:

$$[O] = \begin{vmatrix} 0.00053 \\ -0.00138 \\ 0.00015 \end{vmatrix}$$

Naturally, the entire current measuring device, namely the sensors, the measurement circuit and the analog to digital converter will be calibrated. In this case, the unit of the decorrelation matrix [G] will be an ampere microcontroller unit.

Thus, according to the calibration, a real current $I_{real}$ will have a different unit. The unit will, for example, be able to be a voltage if the calibration relates only to the sensors $C_i$, a frequency if the calibration relates to the sensors $C_i$ and the measurement circuit MES, a numerical number with a resolution if the calibration relates to the sensors $C_i$, the measurement circuit MES and the analogue to digital converter MC for example.

Thus the decorrelation matrix [G], which can also be referred to as the Gain matrix, and the offset matrix [O], which can also be referred to as the Offset matrix, makes it possible to calibrate all the current measurement device by resolving the problem of correlated sensors and imprecision due to the components of the whole of the measurement device, which it would not have been possible to do using only simple decorrelation or offset vectors.

FIG. 4 shows how the invention can be applied to the numeric regulation of three-phrase currents $I_u$, $I_v$ and $I_w$ of the stator of a reversible machine.

In a non-limiting embodiment, the current measurement method comprises a supplementary step of transforming the measured real currents $I_{real}$ of an n-phase reference frame into a two-phase reference frame by means of a projection matrix [C].

This supplementary step is carried out in order to simplify the calculation and the way of controlling the currents in the phases φ of the stator of the alternator/starter machine.

In the case of n=3, the currents are processed by matrices such as a matrix known by the name Concordia matrix or an another known by the name Clark's matrix, transforming the three-phase currents $I_u$, $I_v$ and $I_w$ into two-phase currents $I_\alpha$ and $I_\beta$. These two-phase currents are applied subsequently to the numeric regulation unit in order to regulate the stator currents. In this way there is obtained:

$$\begin{vmatrix} I_\alpha \\ I_\beta \\ I_h \end{vmatrix} = [C]^{-1} \begin{vmatrix} I_u \\ I_v \\ I_w \end{vmatrix}$$

where $I_h$ is a homopolar component, that is to say $[I_{regul}]=[C]^{-1}[I_{real}]$.

It should be noted that the homopolar component corresponds to the sum of the three-phase currents on a third axis that is perpendicular to the axis Oβ.

In the case of a winding of the phases in a delta well known to persons skilled in the art, the homopolar component corresponds to an internal circulation of currents.

In the case of a winding of the phases in a star, well known to persons skilled in the art, the homopolar component corresponds to the neutral point of the stator, which is the common point between the three phases. If the neutral point is not connected, the homopolar component is neutral.

This matrix $[C]$ and its inverse matrix $[C]^{-1}$ are saved in one of the memories of the microcontroller MC, for example non-rewritable ROM or rewritable EEPROM (not shown).

Figure 5:
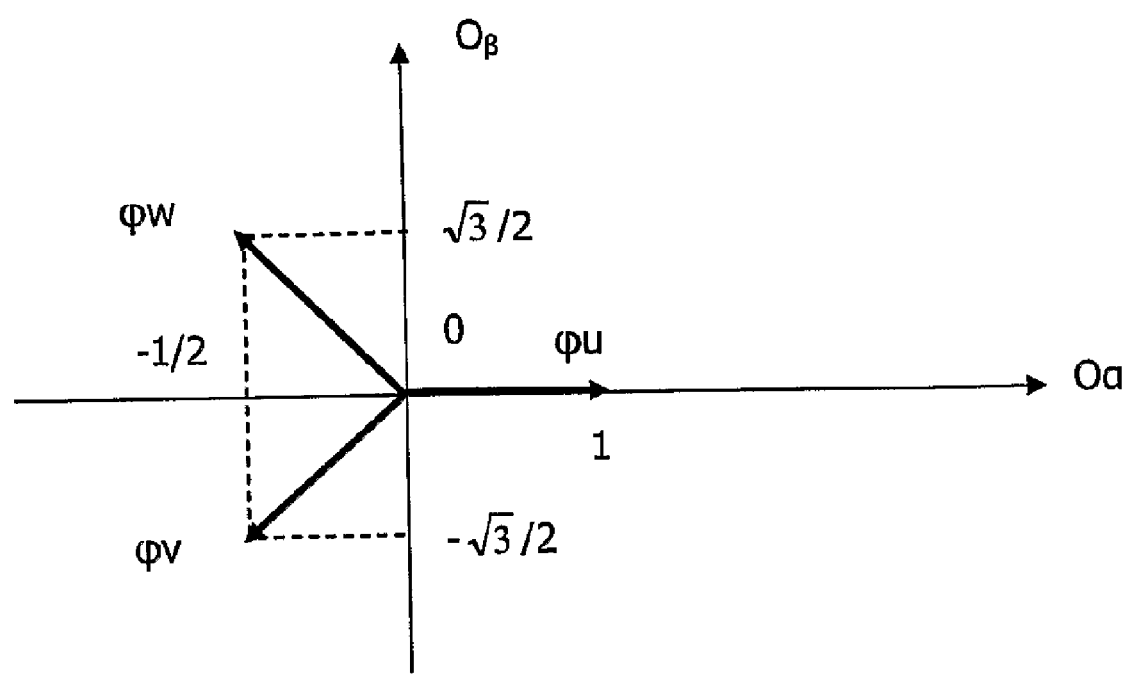
FIG. 5 depicts the projection of three-phase currents in a two-phase current system according to one embodiment of the method of FIG. 4.

FIG. 5 depicts the projection of the three-phase currents $I_u$, $I_v$ and $I_w$ in the system (α, β, O) taking the axis of the first phase $\phi_u$ of the stator, to which the current $I_{measu}$ corresponds, in order to mark the angles.

According to the example of an applicable Concordia projection matrix;

$$[C] = \sqrt{(2/3)} \begin{vmatrix} 1 & 0 & 1/\sqrt{2} \\ -1/2 & (\sqrt{3})/2 & 1/\sqrt{2} \\ -1/2 & (\sqrt{3})/2 & 1/\sqrt{2} \end{vmatrix}$$

and $$[C]^{-1} = \sqrt{(2/3)} \begin{vmatrix} 1 & -1/2 & -1/2 \\ 0 & \sqrt{3}/2 & -\sqrt{3}/2 \\ 1/\sqrt{2} & 1/\sqrt{2} & 1/\sqrt{2} \end{vmatrix}$$

According to the example of an applicable Clark's projection matrix:

$$[C] = \begin{vmatrix} 1 & 0 & 1 \\ -1/2 & -(\sqrt{3})/2 & 1 \\ -1/2 & (\sqrt{3})/2 & 1 \end{vmatrix}$$

and $$[C]^{-1} = 2/3 \begin{vmatrix} 1 & -1/2 & -1/2 \\ 0 & -(\sqrt{3})/2 & (\sqrt{3})/2 \\ 1/2 & 1/2 & 1/2 \end{vmatrix}$$

It should be noted that the coefficients of these projection matrices are constant but are a function of conventions such as the direction of rotation taken of the three-phase currents, the intensity of its currents, etc. Thus it is possible to have a different standardization factor.

Thus it can be seen that the two-phase currents $I_\alpha$ and $I_\beta$ can be directly obtained from the measured currents $I_{meas}$ by the device at FIG. 2 by means of a single matrix $[M]$ that is written: $[M]=[C]^{-1}\cdot[G]^{-1}=[G.C]^{-1}$.

There is then the following equation:

$[I_{\alpha,\beta}] = [M]\cdot([I_{meas}]-[O])$

It should be noted that the products of the two matrices $[G]^{-1}$ and $[C]^{-1}$ are effected offline, in that the rotation of the machine and therefore the stator-rotor angle θ are not taken into account.

In the case where it is wished to work in the reference frame of the machine, that is to say to take into account the stator-rotor angle θ and therefore make a calculation of the currents online, namely in real time, it is assumed that the axes Oα and Oβ are offset by the angle θ with respect to the axis of the first phase $\phi_u$. The new axes are the direct axis $O_d$ and the quadrature axis $O_q$ well known to persons skilled in the art. Thus there is a change from the system (α, β, θ) to the system (d, q, O) by applying a rotation matrix $[R]$:

$$[R] = \begin{vmatrix} \cos\theta & \sin\theta & 0 \\ -\sin\theta & \cos\theta & 0 \\ 0 & 0 & 1 \end{vmatrix}$$

There is thus:

$$\begin{vmatrix} X_\alpha \\ X_\beta \\ 0 \end{vmatrix} = [R] \begin{vmatrix} X_d \\ X_q \\ 0 \end{vmatrix}$$

That is to say:

$$\begin{vmatrix} X_d \\ X_q \\ 1 \end{vmatrix} = [R] \begin{vmatrix} X_\alpha \\ X_\beta \\ 1 \end{vmatrix}$$

Use is made of a transformation known by the name Park $[P]$, which is the product of the projection matrix (Concordia or Clark) and the rotation matrix $[R]$.

$$P = \begin{vmatrix} \cos\theta & \sin\theta & 1 \\ \cos(\theta-2\pi/3) & \sin(\theta-2\pi/3) & 1 \\ \cos(\theta-4\pi/3) & \sin(\theta-4\pi/3) & 1 \end{vmatrix}$$

In this way the inverse Park matrix $[P]^{-1}=[R]^{-1}\cdot[C]^{-1}$ is applied to the measured currents $I_{meas}$ in order to obtain the new currents $I_{dq}$, including where applicable the offset matrix [O]. In this way there is obtained $$[I_{dq}] = [P]^{-1} \cdot [G]^{-1} \cdot ([I_{meas}] - [O])$$
$$= [R]^{-1} \cdot [C]^{-1} \cdot [G]^{-1} \cdot ([I_{meas}] - [O])$$
$$= [R]^{-1} \cdot [M] \cdot ([I_{meas}] - [O])$$

This Park transformation makes it possible to obtain a more efficient control of the machine currents. In this way continuous quantities are obtained instead of variable or alternative quantities, continuous quantities being easier to regulate.

It should be noted that, before the normal functioning of the inverter-rectifier, the matrices [G], [O] and [M] are calculated by the microcontroller MC once and for all.

Thus the current measuring method has a certain advantage compared with a theoretical calculation of the decorrelation matrix made by a computer, the latter not knowing the interference due for example to the components adjacent to the sensors and the imprecision due to the sensors. In addition, the method of the invention is more simple than a calculation by computer. Finally, the method according to the invention allows complete decorrelation of the current measurements in the various conductors. It should be noted that this decorrelation is different from a decorrelation between a flux and a current measured in a conductor, a decorrelation that pursues a different aim from the decorrelation of the currents.

It should be noted that the method according to the invention is applicable not only to a measurement of currents in a rotary electrical machine but also in any application in which a measurement on a plurality of currents is necessary in a restricted space giving rise to a correlation between the measurements and therefore requiring decorrelation, such as for example a battery management system, normally called BMS, in a car or a DC/DC converter. This is because a battery management system generally comprises a housing comprising various connectors to which there are connected a battery and consumers such as air-conditioning and a hi-fi management system. For correct functioning of the battery and consumers it is necessary to measure the currents passing through them.

Likewise, a DC/DC voltage converter comprises various cells or components in which the currents pass and an input current and an output current that it is necessary to measure. It should be noted that a DC/DC converter can be used in a 42 V vehicle in which the battery is at 42 V and the consumers are at 12 V, the converter making it possible to change from 42 V to 12 V.

While the method and product herein described constitute preferred embodiments of this invention, it is to be understood that the invention is not limited to this precise method and product, and that changes may be made therein without departing from the scope of the invention which is defined in the appended claims.

What is claimed is:

1. A method of measuring an electric current in a plurality (n) of conductors, said method comprising the steps of:
    placing an electric current transducer substantially opposite each conductor (I, I=1, . . . , n), one conductor being rigid,
    constructing a decorrelation matrix that is a function of the position of the electric current transducers with respect to said conductors,
    measuring the currents in each conductor by means of said electric current transducers and deducing therefrom real currents by means of said decorrelation matrix and said measured currents:
    wherein said decorrelation matrix comprises elements that are determined by successively applying in each conductor a calibrated current, the current applied in the other conductors being zero, and measuring by means of said transducers an electric current signal associated with each conductor.

2. The method according to claim 1, wherein said real currents are deduced from the measured currents by applying the inverse matrix of the decorrelation matrix.

3. A method of measuring an electric current in a plurality (n) of conductors, said method comprising the steps of:
    placing an electric current transducer substantially opposite each conductor (I, I=1, . . . , n), one conductor being rigid,
    constructing a decorrelation matrix that is a function of the position of the electric current transducers with respect to said conductors,
    measuring the currents in each conductor by means of said electric current transducers and deducing therefrom real currents by means of said decorrelation matrix and said measured currents;
    wherein said method also comprises a step of determining an offset matrix whose elements are equal to the currents measured in each conductor in the absence of current supplied in said conductors, the real currents being deduced from the currents measured by means of the decorrelation matrix and said offset matrix.

4. The method according to claim 3, wherein a matrix of real currents is obtained by subtracting the offset matrix from a matrix of the measured currents and applying the inverse matrix of the decorrelation matrix to the result obtained.

5. The method according to claim 1, wherein said electric current transducers are Hall effect sensors.

6. A device for implementing the method according to claim 1, wherein said method comprises the steps of situating a plurality of electric current transducers, each transducer being placed substantially opposite each conductor.

7. A device according to claim 6, wherein said electric current transducers are Hall effect sensors.

8. The method according to claim 1, wherein said method further comprises the step of:
    applying said measurement of the electric current in input/output conductors of poles of a stator of a rotary electrical machine.

9. A method of measuring an electric current in a plurality (n) of conductors, said method comprising the steps of:
    placing an electric current transducer substantially opposite each conductor (I, I=1, . . . , n), one conductor being rigid,
    constructing a decorrelation matrix that is a function of the position of the electric current transducers with respect to said conductors,
    measuring the currents in each conductor by means of said electric current transducers and deducing therefrom real currents by means of said decorrelation matrix and said measured currents;
    wherein said method further comprises the step of:
    applying said measurement of the electric current in input/output conductors of poles of a stator of a rotary electrical machine;
    wherein an inverse projection matrix is multiplied by the inverse matrix of a decorrelation matrix in order to produce a single matrix applied to the measured output currents of the stator in order to effect a numeric regulation of currents of the said rotary electrical machine.

10. Application according to claim 9, wherein, prior to the application of the single matrix to the measured currents, an offset matrix is applied to the measured output currents of the stator.

11. Application of the method according to claim 1, to the measurement of the electric current in a battery management system.

12. Application of the method according to claim 1 to the measurement of the electric current in a voltage converter system.

13. A system for measuring an electric current in a plurality of conductors associated with poles of a stator in an electric motor, said system comprising:
- a plurality of electric current transducers situated in operative relationship opposite each of said plurality of conductors, respectively; and
- a measuring circuit for measuring current in each of said plurality of conductors using said plurality of electric current transducers and deducing therefrom real currents using a decorrelation matrix and said measured currents;
- wherein said decorrelation matrix is a function of a position of the electric current transducers with respect to said plurality of conductors;
- wherein said decorrelation matrix comprises elements that are determined by successively applying in each of said plurality of conductors a calibrated current, the current applied in the other of said plurality of conductors being zero, said measuring circuit using said plurality of electric current transducers to measure an electric current signal associated with each of said plurality of conductors.

14. The system as recited in claim 13, wherein said real currents are deduced from measured currents by applying an inverse matrix of the decorrelation matrix.

15. A system for measuring an electric current in a plurality of conductors associated with poles of a stator in an electric motor, said system comprising:
- a plurality of electric current transducers situated in operative relationship opposite each of said plurality of conductors, respectively; and
- a measuring circuit for measuring current in each of said plurality of conductors using said plurality of electric current transducers and deducing therefrom real currents using a decorrelation matrix and said measured currents;
- wherein said decorrelation matrix is a function of a position of the electric current transducers with respect to said plurality of conductors, wherein said measuring circuit uses an offset matrix whose elements are equal to the currents measured in each of said plurality of conductors in the absence of current supplied in said plurality of conductors, said real currents being deduced from the currents measured using said decorrelation matrix and said offset matrix.

16. The system as recited in claim 15, wherein said real currents are deduced into a matrix of real currents that is obtained by subtracting said offset matrix from a matrix of the measured currents and applying an inverse matrix of the decorrelation matrix to the result obtained.

17. The system as recited in claim 13, wherein said plurality of electric current transducers are Hall effect sensors.

18. The system as recited in claim 13, wherein each of said plurality of electric current transducers is placed substantially opposite each of said plurality of conductors.

* * * * *